United States Patent [19]

Connors et al.

[11] 4,156,286
[45] May 22, 1979

[54] SOLID STATE DATA RECORDER

[75] Inventors: John P. Connors, Silver Spring; Henry P. Bell, Laurel, both of Md.

[73] Assignee: The United States of America as represented by the Secretary of the Navy, Washington, D.C.

[21] Appl. No.: 852,186

[22] Filed: Nov. 16, 1977

[51] Int. Cl.$^2$ .................. G11C 13/00; G11C 11/40
[52] U.S. Cl. ................................. 365/45; 365/182; 365/73
[58] Field of Search .................. 365/45, 73, 76, 77

[56] References Cited

U.S. PATENT DOCUMENTS

| 3,278,907 | 10/1966 | Barry | 365/45 |
| 3,991,409 | 11/1976 | Dautremont | 365/45 |

*Primary Examiner*—Terrell W. Fears
*Attorney, Agent, or Firm*—R. S. Sciascia; A. L. Branning; G. J. Perry

[57] ABSTRACT

A solid state data recording system for storing multi-channel analog data. This low power system has characteristics similar to a high performance analog tape recorder but has no moving parts and can be easily ruggedized for severe environmental conditions. In the "write" mode analog data are sampled and converted to digital bits of information. These individual bits are stored in a solid state storage medium by coded enabling and address information provided by a controller. The information is played back by reading out these digital bits, converting them to analog form, and then demultiplexing them to their original channels.

10 Claims, 4 Drawing Figures

SOLID STATE DATA RECORDER

BACKGROUND OF THE INVENTION

The present invention relates to analog recording systems and more particularly to high performance multichannel recording systems used under severe environmental conditions.

When it is necessary to record analog data for later analysis high performance analog tape recorders are frequently used. Very often, and particularly when used in missile systems, these tape recorders are subject to high accelerations, shock, extreme temperatures, and other severe environmental conditions. In addition, these recorders are required to withstand launch transients and maneuvering accelerations while properly recording the data. Typical analog tape recorders currently in use allow for the recordation of eight to sixteen channels of information with a recording time period on the order of one minute.

Usually, much of this one minute recording time is wasted. The recorder must be turned on before launch of the missile carrying it so that the launch transient can be recorded. Furthermore, since tape recorders depend on accurate tape transport speed, sufficient time must be allowed for the tape to obtain this speed before the data can be assumed to be reliable. In addition, the useful missile flight may be less than one minute. This would leave only the launch transient to missile burnout time as the useful data period on the one minute tape. In many cases this may be as small as five to fifteen seconds of useful data. In a typical situation, the first ten seconds are used to bring the tape transport up to speed. Useful data is recorded during the next twenty seconds and the final thirty seconds are merely tape run-off after shutdown.

SUMMARY OF THE INVENTION

Accordingly, the present invention provides a low power solid state data recording system that has characteristics similar to a high performance analog tape recorder but which utilizes a solid state recording medium instead of transported tape for the data recordation. Analog signals are routed through a multiplexer under the direction of a controller. The controller then routes these signals through a sample and hold module, through an analog to digital converter and into the storage medium, a solid state memory. After all data has been stored and it is desired to play back, the controller sequences recovering the data from the solid state storage, routing it through a digital to analog converter, demultiplexing it and storing it in a sample and hold module.

It is therefore, an object of the present invention to provide a solid state data recording device.

A further object of the present invention is to provide a solid state recording device which has low power requirements.

Another object of the present invention is to provide a data recording device having no moving parts.

Still another object of the present invention is to provide a solid state data recorder capable of recording DC levels directly without special modulation.

Yet another object of the present invention is to provide a data recording system that is highly accurate, rugged, and that will withstand extreme environmental conditions.

Still another of the present invention is to provide a data recording device that is capable of withstanding launch shocks when carried on board a rocket or missile.

A further object of the present invention is to provide a solid state data recording device having a minimum one channel frequency response of DC to 50,000 Hz.

BRIEF DESCRIPTIONS OF THE DRAWINGS

Other objects and many of the attendant advantages of the present invention will be readily apparant as the invention becomes better understood by reference to the following detailed description with the appended claims, when considered in conjunction with the accompanying drawings wherein:

DESCRIPTION OF THE PREFERRED EMBODIMENTS

Figure 1:
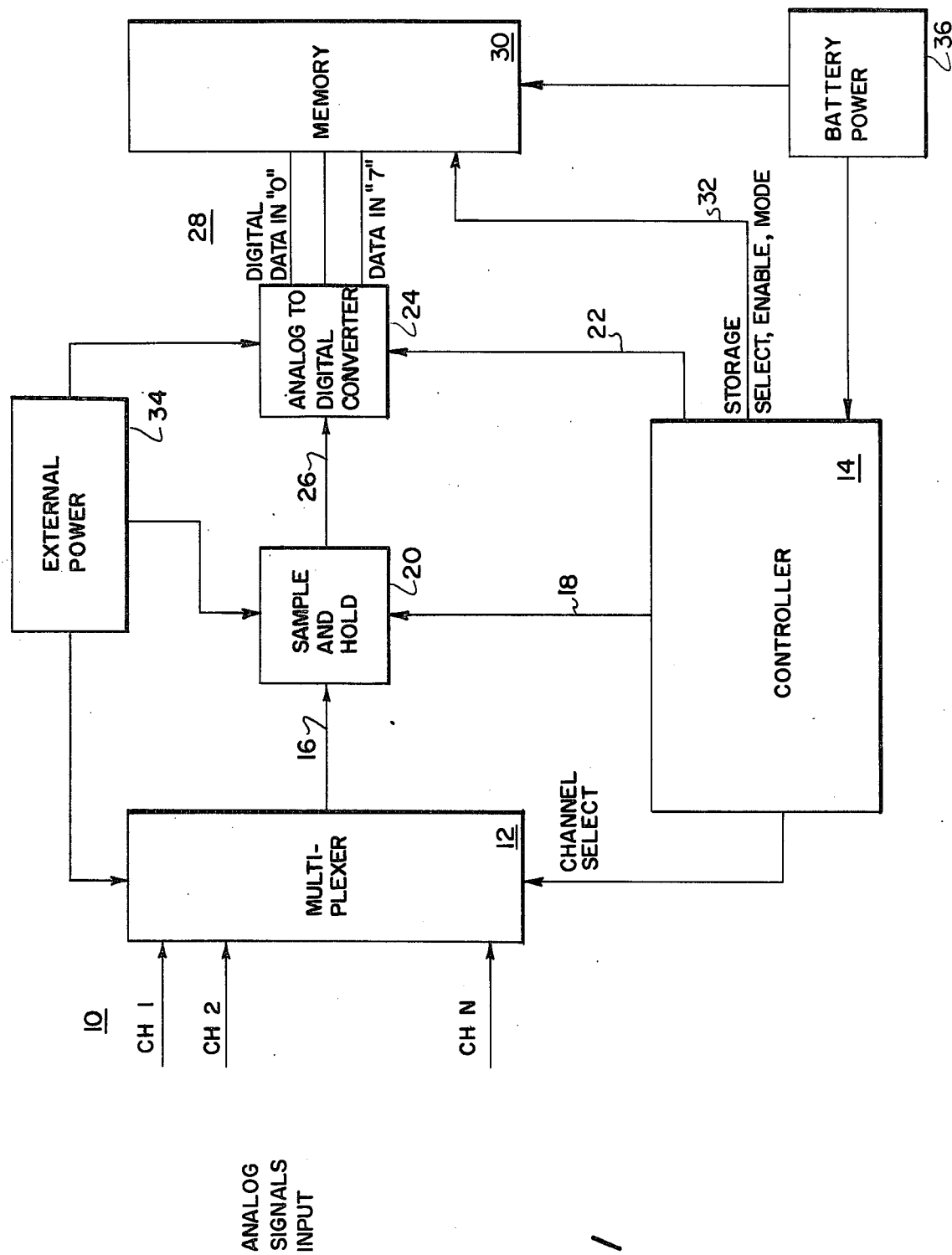
FIG. 1 is a functional block diagram of the solid state data recorder according to the present invention operating in the "write" mode.

Referring now to the drawings wherein like reference characters designate like or corresponding parts throughout the several views, FIG. 1 shows a function block diagram of the "record" mode of the solid state data recorder. Multichannel input analog data signals 10 are routed through a multiplexer 12 in sequence by a controller 14. All analog data signals 10 will then appear on a serial data line 16. As each channel of input analog data signals 10 are multiplexed onto serial data line 16, controller 14 provides a hold signal 18 to a sample and hold module 20. Controller 14 then provides a convert start signal 22 to an analog to digital converter 24, the input to which is coupled to the output 26 of sample and hold module 20. Analog to digital converter 24 converts the analog signal at the output of sample and hold module 26 to a digital representation of that analog signal on eight digital data lines 28. Controller 14 then selects and enables via a circuit line 32, a solid state memory 30 coupled to digital data lines 28 instructing the memory to store the information on these data lines. Controller 14 causes this record scheme to occur for each of the analog input signals 10 beginning with channel 1 and sequencing through all channels and restarting at channel 1 again. This procedure continues until write mode operation is complete, at which time controller 14 generates a stop signal. The multiplexer 12, sample and hold module 20, and analog to digital converter 24 are powered by an external power source 34, while the controller 14 and memory 30 are powered by a battery 36. A stop signal generated by controller 14 allows external power source 34 to be disconnected from the data recorder after writing has been accomplished. Components of the controller 14 and memory 30 are selected to be low power drain devices so that once external power 34 is removed, the data recorder will be in a low power drain mode.

Solid state memory 30 can be constructed from a number of devices. One such memory unit is an array of CMOS devices. Building the solid state memory from such devices will cause the memory to be volatile, that is, the data stored in it will be lost if the memory is powered down. Volatile memory would not be a problem if memory 30 were built from an array of programmable read only memories. Other attractive storage media would be charge coupled devices and magnetic bubbles.

Figure 2:
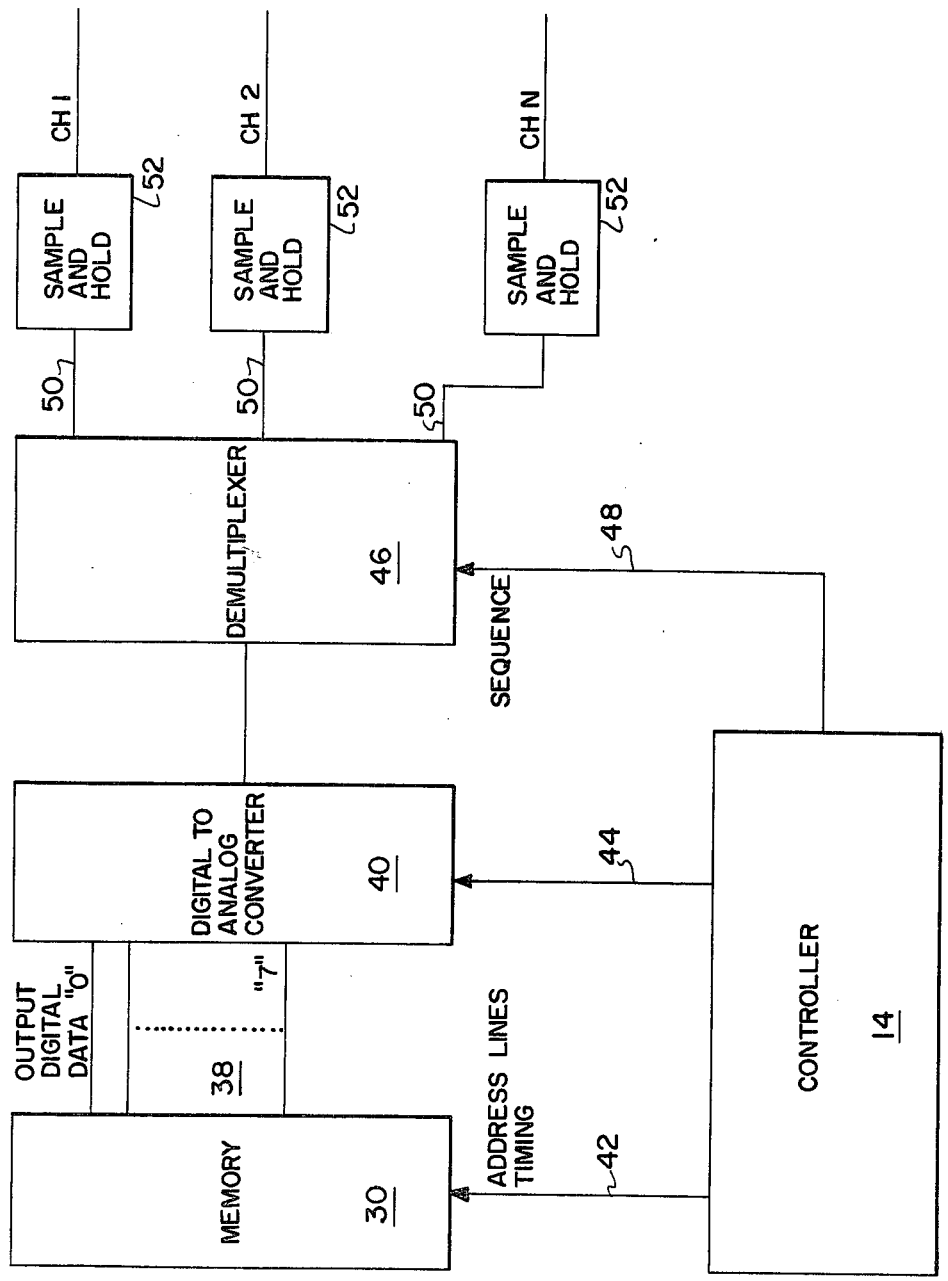
FIG. 2 is a functional block diagram of the solid state data recorder according to the present invention operating in the "playback" mode.

The playback mode can best be understood with reference to FIG. 2 which is a functional block diagram. In this mode controller 14 provides timing and sequencing signals necessary to recover the original analog data stored in digital form in memory 30. Eight output digital data lines 38 transmit memory information to a digital to analog converter 40. Specific bits of information are extracted when controller 14 properly addresses memory 30 via address lines 42. Controller 14 sequences through the individual data bits of memory 39 via signals on address line 42 while controlling the digital to analog converter 40 via a digital to analog converter control signal line 44. The output of the digital to analog converter is coupled to a demultiplexer 46 which is sequenced by controller 14 via a sequence line 48. Demultiplexer 46 has a plurality of output lines 50 each corresponding to an original analog data input channel. Each of these output lines 50 is coupled to a sample and hold module 52 which restores the original analog data wave form.

Figure 3:
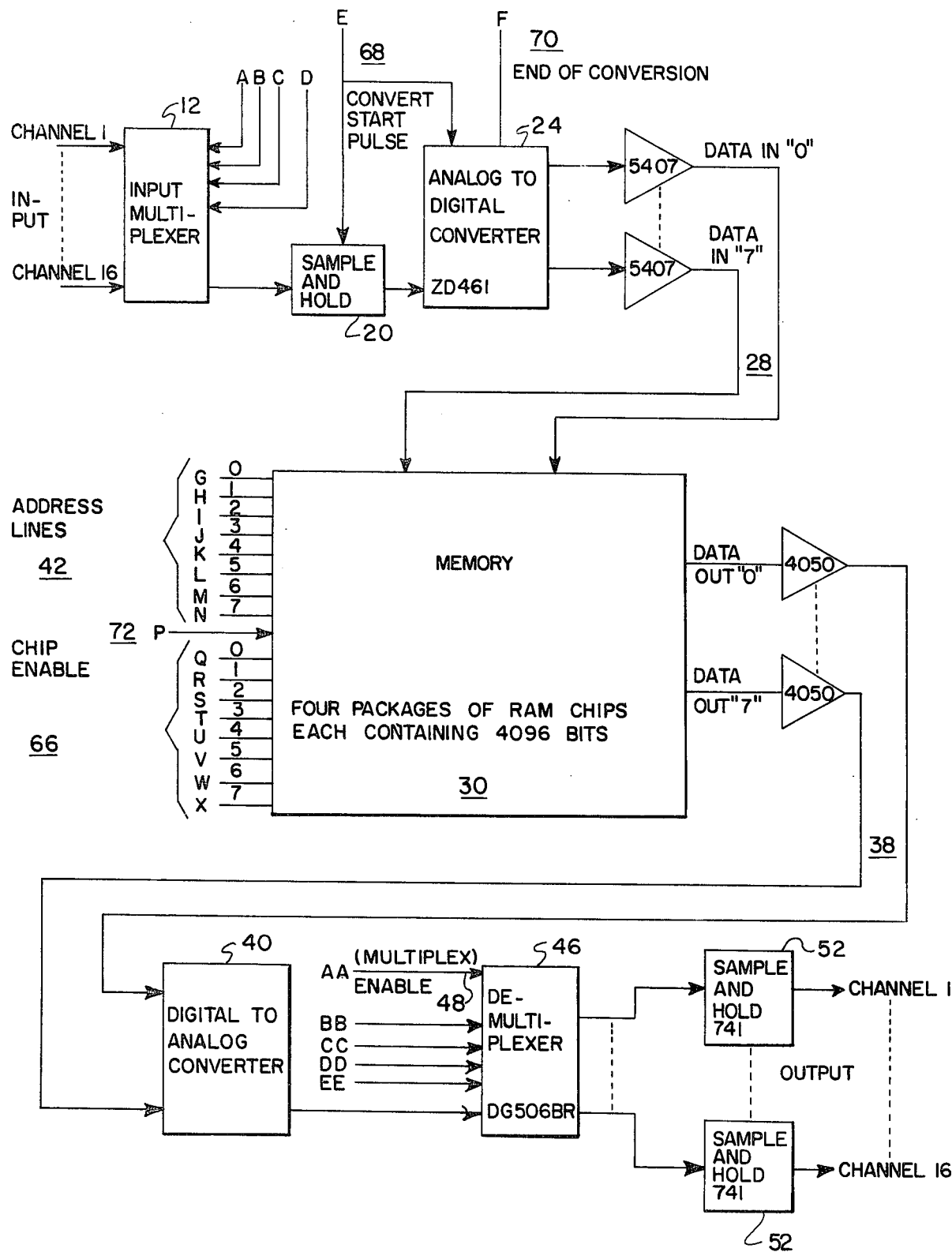
FIG. 3 is a schematic diagram of the input, memory, and playback circuitry.
Figure 4:
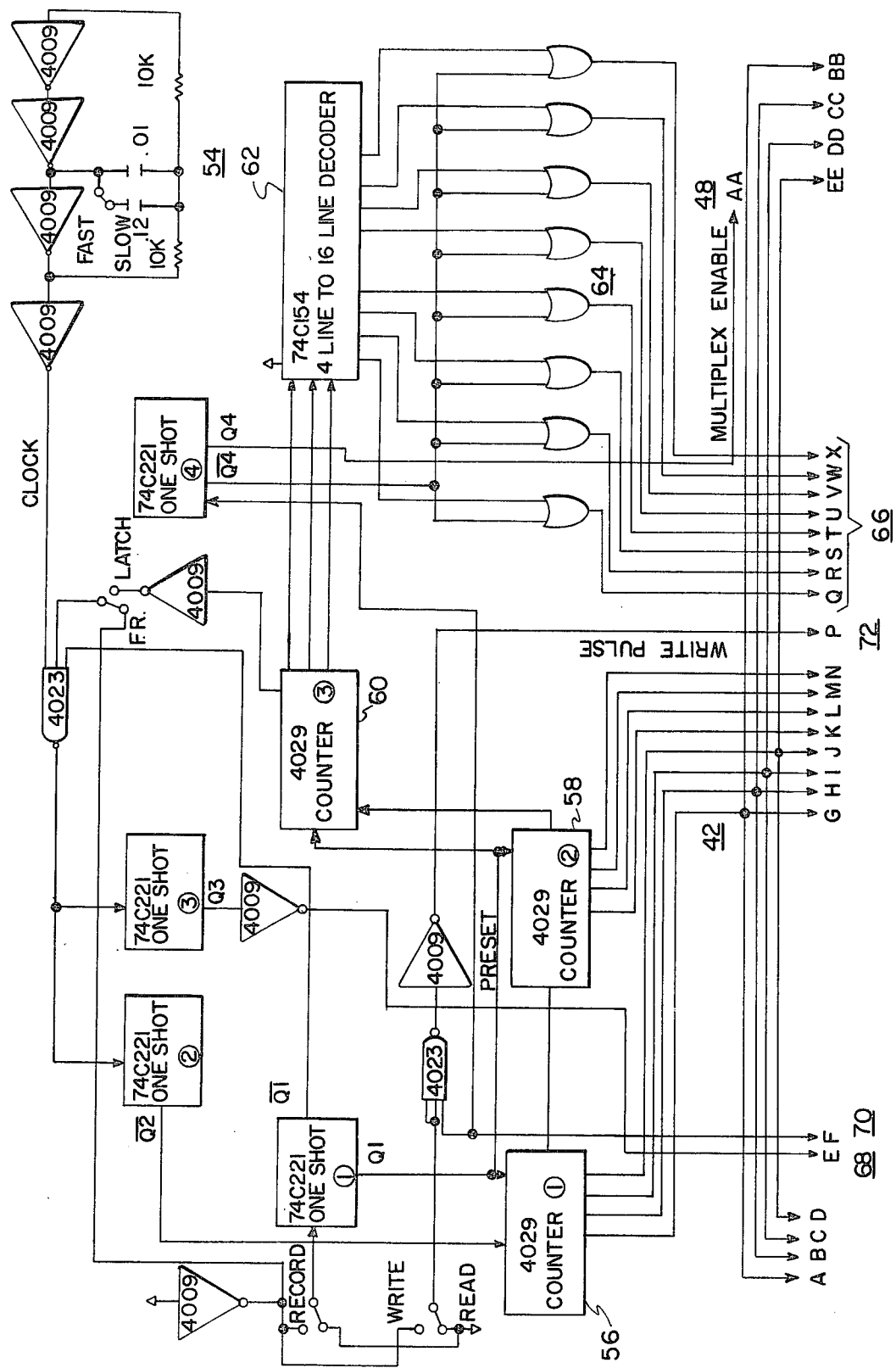
FIG. 4 is a schematic diagram of the controller circuitry.

A detailed schematic of the input, memory, and output circuits is shown in FIG. 3 and FIG. 4 is a detailed schematic of controller 14. Referring now to FIG. 3 solid state memory 30 is shown using four packages of Random Access Memory (RAM) chips each containing 4,096 bits for a total of 16,384 bits of memory. Of course, any solid state memory array could be substituted in place of the RAM chips including but not limited to charge coupled devices and magnetic bubbles. Input multiplexer 12, analog to digital converter 24, digital to analog converter 40, demultiplexer 46, and sample and hold modules 52 are standard commercially available devices whose part numbers are shown on the figure.

The operation of controller 14 is best understood with reference to FIG. 4. The data recorder shown is designed to record 16 channels of analog information at 25 samples per second each. In other words, each channel is sampled in turn and that sampling sequence is repeated 25 times each second. A clock 54 generates a binary signal with a 2.5 ms period. Two counters 56 and 58 count these clock pulses to coordinate address lines to the chip array in memory 30 (not shown on FIG. 4). A 4–16 line decoder 62 in conjunction with chip enable gates 64 drive enable circuitry in memory array 30 through chip enable lines 66. The combined effect of the signals on address lines 42 and chip enable lines 66 assure that sample information converted into digital form by analog to digital converter 24 is stored in proper sequence in memory 30. The object of controller 14 is to provide that sequence in the record mode so that the same sequence can be repeated in playback mode. Each time analog information is sampled and multiplexed through input multiplexer 12 it is momentarily held by sample and hold module 20. At this point in time controller 14 sends a "convert start pulse" down convert start line 68 to analog to digital converter 24. This pulse triggers the beginning of conversion to digital format. At the end of conversion, analog to digital converter 24 sends an "end of conversion" signal up end of conversion line 70. This end of conversion signal on line 70 causes controller 14 to initiate a write pulse on a write pulse line 72 initiating the storage of the information appearing on digital data lines 28. By the action of these signals controller 14 has coordinated an address line, chip enable, and write instructions to record data in the order sampled through a logical sequence of chip addresses. When this sequence is repeated in playback, the information demultiplexed in demultiplexer 46 will correspond to the input analog data to input multiplexer 12.

In playback mode, information retrieved from memory 30 that is analog converted in digital to analog converter 40 passes to demultiplexer 46. Converter 14 initiates a multiplex enable signal on sequence line 48 signaling demultiplexer 46 to transmit the analog data to the appropriate channel.

Therefore, it is apparent that there has been provided a solid state recorder suitable for the recordation of 16 channels of analog information. The use of analog to digital converters having a conversion rate of 10 microseconds allows a one channel frequency response of DC to 50,000 Hz. It is capable of recording DC levels directly, thus eliminating additional electronics normally associated with tape recorders, such as a Voltage Controlled Oscillator to provide DC-FM conversion. The device, being completely solid state, eliminates all moving parts which allows the device to be easily ruggedized for severe environmental conditions such as high shock, high humidity, high pressure, etc. In addition, the wow and flutter problems generally associated with tape speed control are eliminated. The heart of this solid state system is a digital clock which can be crystal controlled. Since there are no motors for tape transport, this device consumes less power than a tape recorder of comparable capacity.

Accuracy of the system is determined by the resolution of the analog to digital converter. Accuracy on the order of one part per 4,096 can be easily obtained and is substantially better than tape systems in current use.

The frequency response of the system can even be adjusted during the recording session to optimally use the storage medium. For example, launch transients of missile or rocket flight can be recorded in high frequency record mode by linking channels and actual vehicle maneuvers can be recorded in the standard low frequency mode.

Obviously, other embodiments and modifications of the present invention will readily come to those of orinary skill in the art having the benefit of the teachings presented in the foregoing description and the drawings. It is, therefore, to be understood that this invention is not to be limited thereto and that said modifications and embodiments are intended to be included within the scope of the appended claims.

What is claimed and desired to be secured by Letters Patent of the United States is:

1. A multichannel analog data recording system comprising:
 means for sequentially sampling each channel of input data to said recording system;
 means coupled to the output of said sampling means for converting each of said samples of data into multi-bit digital format;
 a solid state memory coupled to the output of said digital conversion means;
 means for controlling the storage sequence of said multibit digital format data into said solid state memory;

means for controlling the readout sequence of said multibit digital format data from said solid state memory;

means for converting said digital format data readout from said solid state memory into analog form; and means for demultiplexing said analog signals into various channels of data corresponding to the channels of input data to said recording system.

2. The solid state data recording system of claim 1 wherein said solid state memory includes an array of CMOS devices.

3. The system of claim 1 wherein said solid state memory includes an array of programmable read only memory devices.

4. The system of claim 1 wherein said solid state memory includes an array of charge coupled devices.

5. The system of claim 1 wherein said solid state memory includes an array of magnetic bubbles.

6. A multichannel analog data recording system comprising:

a multiplexer for sequentially sampling analog input data to said recording system;

an analog to digital converter coupled to the output of said multiplexer for converting said sampled analog data into discrete bits of multiple-bit digital information;

a solid state storage medium coupled to the output of said analog to digital converter for the storage of said discrete bits of digital data;

a digital to analog converter coupled to the output of said solid state storage medium for converting said discrete bits of digital data into analog signals;

a demultiplexer coupled to the output of said digital to analog converter having a plurality of outputs, one for each channel, for assigning serial data from said converter to its appropriate channel; and means for controlling the timing and sequence of said multiplexer, analog to digital converter, solid state storage medium, digital to analog converter, and demultiplexer.

7. The system of claim 6 wherein said solid state storage medium is an array of CMOS devices.

8. The system of claim 6 wherein said solid state storage medium includes an array of programmable read only memories.

9. The system of claim 6 wherein said solid solid state storage medium includes an array of charged coupled devices.

10. The system of claim 6 wherein said solid state storage medium includes an array of magnetic bubble devices.

* * * * *